US010568426B1

(12) United States Patent
Chen et al.

(10) Patent No.: US 10,568,426 B1
(45) Date of Patent: Feb. 25, 2020

(54) SLIDE RAIL ASSEMBLY

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 16/247,654

(22) Filed: Jan. 15, 2019

(30) Foreign Application Priority Data

Oct. 25, 2018 (TW) .............................. 107138118 A

(51) Int. Cl.
  *A47B 88/00* (2017.01)
  *A47B 88/43* (2017.01)
  *A47B 88/477* (2017.01)
  *A47B 88/493* (2017.01)

(52) U.S. Cl.
  CPC ............ *A47B 88/43* (2017.01); *A47B 88/477* (2017.01); *A47B 88/493* (2017.01); *A47B 2210/0081* (2013.01)

(58) Field of Classification Search
  CPC ....... A47B 88/43; A47B 88/403; A47B 88/57; A47B 96/067; H05K 7/1489
  See application file for complete search history.

(56) References Cited

U.S. PATENT DOCUMENTS

| 5,871,265 | A | 2/1999 | Stewart et al. | |
| 8,511,765 | B1* | 8/2013 | Chen | A47B 67/04 312/286 |
| 8,733,864 | B2 | 5/2014 | Chen et al. | |
| 9,480,183 | B2 | 10/2016 | Chen et al. | |
| 2009/0283652 | A1* | 11/2009 | Chen | H05K 7/1489 248/298.1 |
| 2014/0265793 | A1 | 9/2014 | Evans et al. | |
| 2015/0123528 | A1 | 5/2015 | Wu | |
| 2016/0029791 | A1 | 2/2016 | Chen et al. | |

FOREIGN PATENT DOCUMENTS

EP         3270670 A1    1/2018

* cited by examiner

*Primary Examiner* — Matthew W Ing
(74) *Attorney, Agent, or Firm* — Alan D. Kamrath; Karin L. Williams; Mayer & Williams PC

(57) ABSTRACT

A slide rail assembly includes a supporting mechanism and a slide rail. The slide rail and the supporting mechanism are movably mounted relative to each other. Wherein, the supporting mechanism and the slide rail have corresponding structures and features, such that the slide rail is movable relative to the supporting mechanism along a first direction to a first extension position, or the slide rail is movable relative to the supporting mechanism along a second direction to a second extension position.

20 Claims, 10 Drawing Sheets

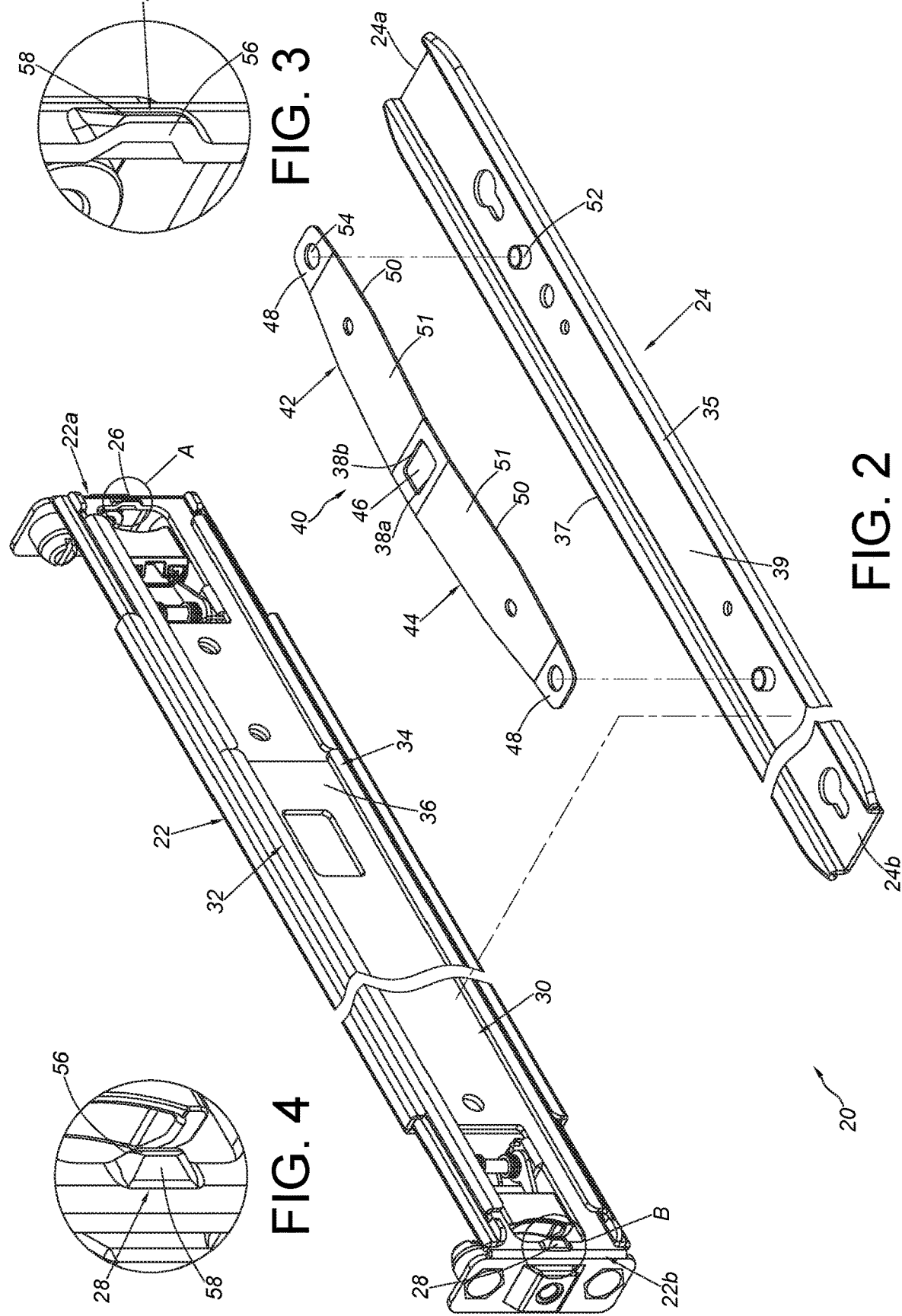

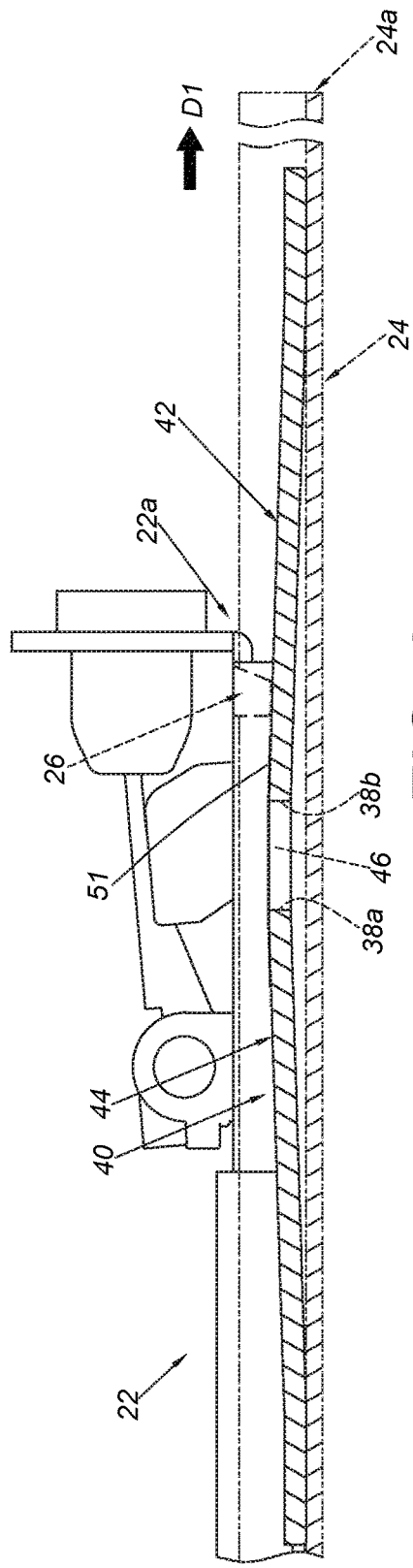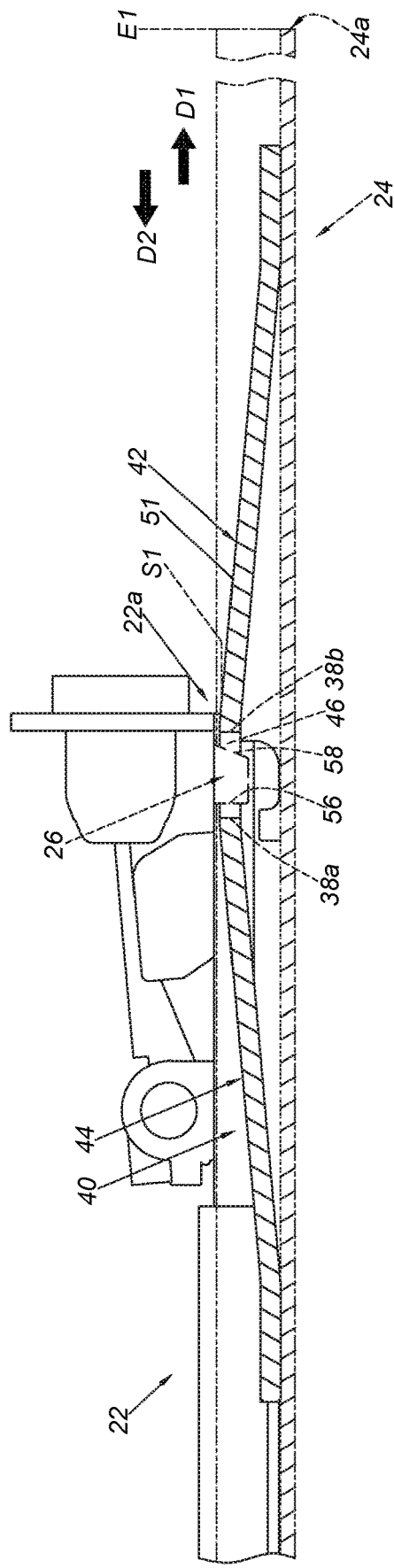

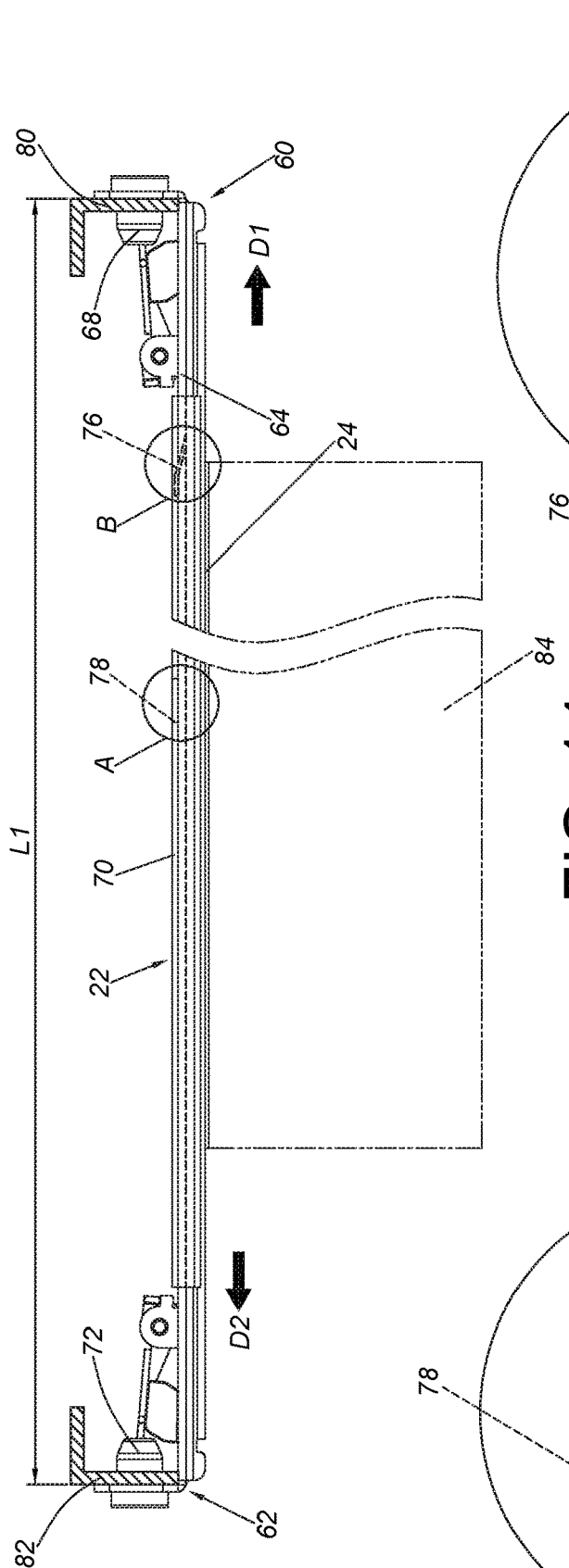
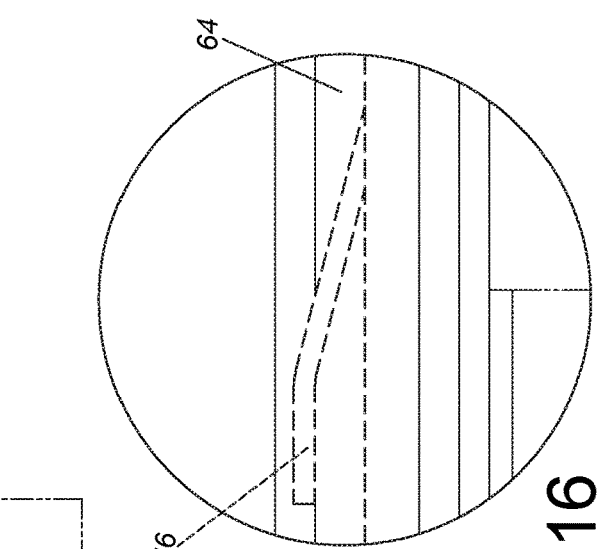
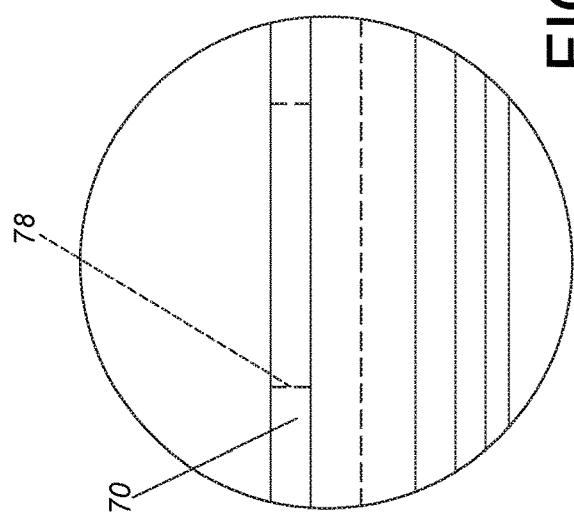
FIG. 14
FIG. 15
FIG. 16

SLIDE RAIL ASSEMBLY

BACKGROUND OF THE INVENTION

1. Field of the Invention

The present invention relates to a slide rail mechanism, and more particularly, to a slide rail assembly configured to be opened in two directions.

2. Description of the Prior Art

Slide rail assemblies have been widely used. For example, the slide rail assembly can be used to carry a carried object, such that the carried object can be opened or retracted relative to a fixed object (such as a cabinet or a rack). U.S. Pat. No. 9,480,183 B2 discloses a slide rail assembly 10 comprising a first rail 44, a second rail 46 and an engaging member 48. Wherein, when the second rail 46 is moved relative to the first rail 44 along a direction to an extension position, a contact portion 66 of the engaging member 48 abuts against a blocking portion 30 of an arm member 26 to block the second rail 46 at the extension position, such that the second rail 46 and a carried object (such as a chassis) carried by the second rail 46 can be prevented from being detached from the first rail 44.

However, for different market requirements, it is important to develop various slide rail products to meet such market requirements.

SUMMARY OF THE INVENTION

The present invention relates to a slide rail assembly configured to be opened in two directions.

According to an embodiment of the present invention, a slide rail assembly comprises a supporting mechanism and a slide rail. The supporting mechanism comprises a first structure, a second structure and a path arranged between the first structure and the second structure. The slide rail is movable through the path. The slide rail has a first end and a second end. A first feature and a second feature are arranged between the first end and the second end. Wherein, when the slide rail is moved along the path in a first direction to a first extension position, the first end of the slide rail exceeds beyond the first structure, and the first structure is configured to block the first feature, in order to prevent the slide rail from being moved from the first extension position along the first direction. Wherein, when the slide rail is moved along the path in a second direction to a second extension position, the second end of the slide rail exceeds beyond the second structure, and the second structure is configured to block the second feature, in order to prevent the slide rail from being moved from the second extension position along the second direction. Wherein, the first direction is opposite to the second direction.

Preferably, the first structure is arranged adjacent to a first end part of the supporting mechanism, and the second structure is arranged adjacent to a second end part of the supporting mechanism.

Preferably, when the slide rail is located at the first extension position, the first structure is configured to block the second feature, in order to prevent the slide rail from being moved from the first extension position along the second direction.

Preferably, when the slide rail is located at the second extension position, the second structure is configured to block the first feature, in order to prevent the slide rail from being moved from the second extension position along the first direction.

Preferably, the slide rail assembly further comprises a working member mounted to the slide rail. The working member is arranged with the first feature and the second feature, and a space is formed between the first feature and the second feature. When the slide rail is located at the first extension position, the first structure is located at a position corresponding to the space, and the first feature and the second feature are respectively located at two sides of the first structure. When the slide rail is located at the second extension position, the second structure is located at a position corresponding to the space, and the first feature and the second feature are respectively located at two sides of the second structure.

Preferably, the working member comprises two elastic parts, and the first feature and the second feature are arranged between the two elastic parts.

Preferably, each of the two elastic parts has a connecting section and an elastic section. The connecting section is mounted to the slide rail. The elastic section is extended from the connecting section and tilted relative to the connecting section. The first feature and the second feature are respectively arranged on the two elastic sections.

Preferably, when the slide rail is located at the first extension position and when the elastic section is pressed, the first feature and the second feature are no longer located at the two sides of the first structure, such that the slide rail at the first extension position is detachable from the supporting mechanism along the first direction, or the slide rail at the first extension position is retractable relative to the supporting mechanism along the second direction.

Preferably, when the slide rail is located at the second extension position and when the elastic section is pressed, the first feature and the second feature are no longer located at the two sides of the second structure, such that the slide rail at the second extension position is detachable from the supporting mechanism along the second direction, or the slide rail at the second extension position is retractable relative to the supporting mechanism along the first direction.

Preferably, the elastic section has a guiding surface configured to interact with the first structure or the second structure.

Preferably, the first structure and/or the second structure is a protrusion.

Preferably, the supporting mechanism comprises a first bracket and a second bracket retractably movable relative to each other. One of the first bracket and the second bracket has the path. The first bracket and the second bracket respectively comprise at least one first mounting member and at least one second mounting member configured to be mounted to a rack.

According to another embodiment of the present invention, a slide rail assembly comprises a supporting mechanism, a slide rail and a working member. The working member is operatively mounted to the slide rail. The working member is configured to be in one of a first state and a second state. Wherein, the supporting mechanism and the slide rail are movably mounted relative to each other through a passage. Wherein, when the slide rail is moved from a predetermined position to a first extension position along a first direction and when the working member is in the first state, a first structure of the supporting mechanism is configured to block a first feature of the working member in order to prevent the slide rail from being moved along the first direction. Wherein, when the working member is operated to be switched from the first state to the second state, the first structure of the supporting mechanism no longer blocks the first feature of the working member, such that the slide rail is detachable from the supporting mechanism along the first direction. Wherein, when the slide rail is moved from the predetermined position to a second extension position along a second direction and when the working member is in the first state, a second structure of the supporting mechanism is configured to block a second feature of the working member in order to prevent the slide rail from being moved along the second direction. Wherein, when the working member is operated to be switched from the first state to the second state, the second structure of the supporting mechanism no longer blocks the second feature of the working member, such that the slide rail is detachable from the supporting mechanism along the second direction. Wherein, the first direction is opposite to the second direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is an exploded view of the slide rail assembly in a first implementation type according to an embodiment of the present invention;

FIG. 3 is an enlarged view of an area A of FIG. 2;

FIG. 4 is an enlarged view of an area B of FIG. 2;

FIG. 6 is a diagram showing the slide rail of the slide rail assembly being moved relative to the supporting mechanism along a first direction according to an embodiment of the present invention;

FIG. 7 is a diagram showing the slide rail of the slide rail assembly being located at a first extension position relative to the supporting mechanism according to an embodiment of the present invention;

FIG. 14 is a diagram showing the slide rail assembly being mounted to a rack with a first depth, and the slide rail configured to carry a carried object according to an embodiment of the present invention;

FIG. 15 is an enlarged view of an area A of FIG. 14;

FIG. 16 is an enlarged view of an area B of FIG. 14;

DETAILED DESCRIPTION

Figure 1:
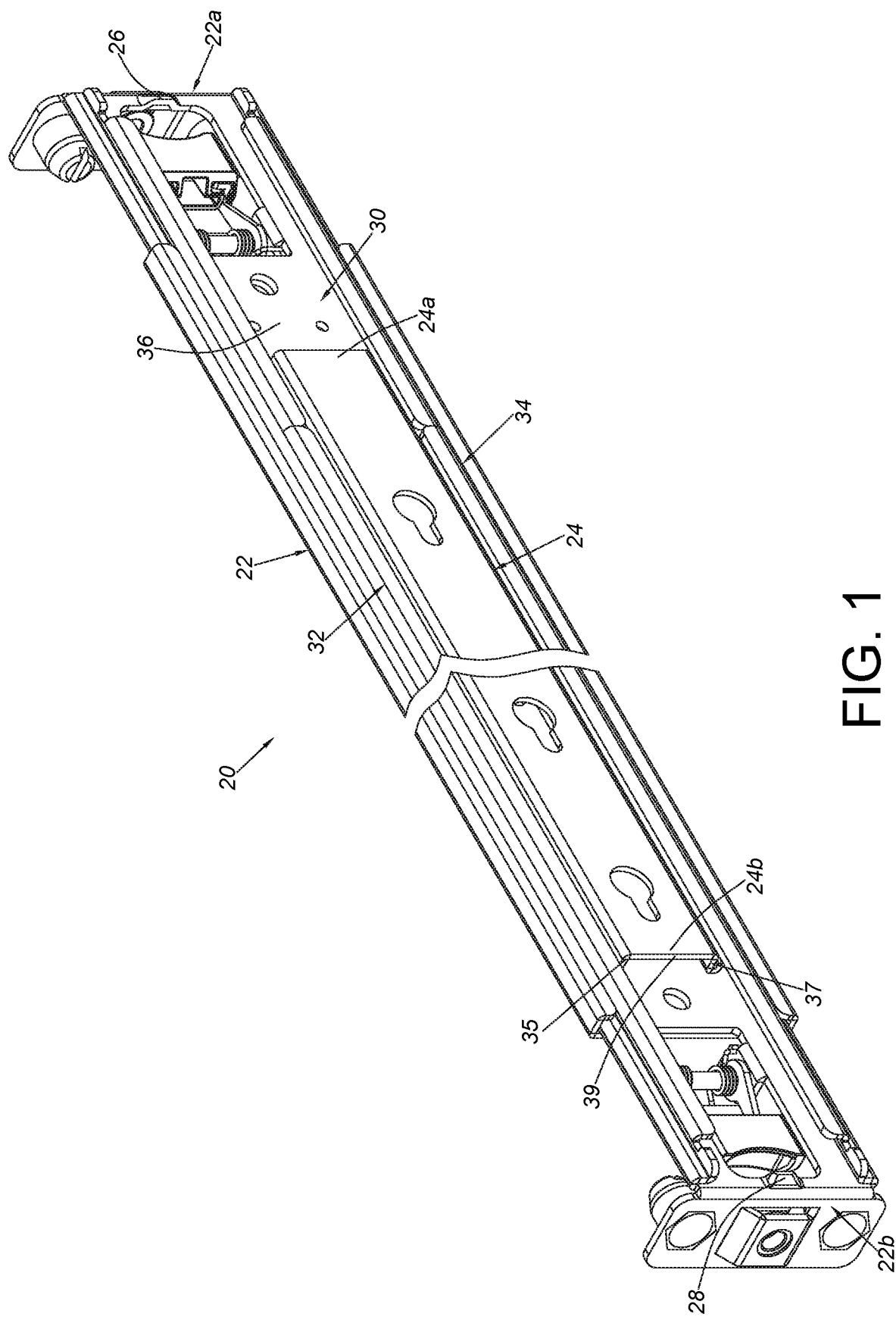
FIG. 1 is a diagram showing a slide rail assembly according to an embodiment of the present invention.

As shown in FIG. 1 and FIG. 2, a slide rail assembly 20 comprises a supporting mechanism 22 and a slide rail 24 according to an embodiment of the present invention.

The supporting mechanism 22 comprises a first structure 26 (please also refer to FIG. 3), a second structure 28 (please also refer to FIG. 4) and a path 30 arranged between the first structure 26 and the second structure 28. Preferably, the supporting mechanism 22 comprises a first end part 22a and a second end part 22b. For example, the first end part 22a and the second end part 22b can be respectively a front part and a rear part, but the present invention is not limited thereto. Moreover, the second end part 22b is away from the first end part 22a. The first structure 26 is arranged adjacent to the first end part 22a, and the second structure 28 is arranged adjacent to the second end part 22b. Preferably, the supporting mechanism 22 comprises an upper wall 32, a lower wall 34 and a longitudinal wall 36 connected between the upper wall 32 and the lower wall 34. A passage is defined by the upper wall 32, the lower wall 34 and the longitudinal wall 36. The passage is configured to provide the path 30.

The slide rail 24 is movable relative to the supporting mechanism 22 through the path 30. In other words, the slide rail 24 and the supporting mechanism 22 are movably mounted to each other through the passage. Moreover, the slide rail 24 has a first end 24a and a second end 24b, and a first feature 38a and a second feature 38b are arranged between the first end 24a and the second end 24b. Preferably, the slide rail 24 comprises a first wall 35, a second wall 37 and a side wall 39 connected between the first wall 35 and the second wall 37. Wherein, the first wall 35 and the second wall 37 of the slide rail 24 are configured to be respectively supported by the upper wall 32 and the lower wall 34 of the supporting mechanism 22, and the side wall 39 of the slide rail 24 is located at a position corresponding to the longitudinal wall 36 of the supporting mechanism 22. Preferably, the slide rail assembly 20 further comprises a working member 40 mounted to the slide rail 24. In the present embodiment, the working member 40 is operatively mounted to the side wall 39 of the slide rail 24, and the working member 40 is configured to face toward the longitudinal wall 36 of the supporting mechanism 22. Wherein, the working member 40 is arranged with the first feature 38a and the second feature 38b. Preferably, the working member 40 comprises a first elastic part 42 and a second elastic part 44, and the first feature 38a and the second feature 38b are arranged between the first elastic part 42 and the second elastic part 44. Preferably, a space 46 is formed between the first feature 38a and the second feature 38b, and the first feature 38a and the second feature 38b are walls at two sides of the space 46. Preferably, each of the first elastic part 42 and the second elastic part 44 has a connecting section 48 and an elastic section 50. Wherein, the connecting section 48 is mounted to the slide rail 24. For example, the connecting section 48 and the slide rail 24 are mounted to each other through matching of a connecting object 52 and a hole 54 (such as a longitudinal hole). Preferably, a diameter of the hole 54 is slightly greater than that of the connecting object 52, such that the working member 40 can be slightly moved relative to the slide rail 24 while an external force is applied to the working member 40. Or, the working member 40 can be fixed to the slide rail 24 through the connecting section 48 by riveting or welding. However, the manner for mounting the working member 40 to the slide rail 24 in the present invention is not limited thereto. On the other hand, the elastic section 50 is extended from the connecting section 48 and tilted relative to the connecting section 48. The first feature 38a and the second feature 38b are respectively arranged on the elastic section 50 of the second elastic part 44 and the elastic section 50 of the first elastic part 42. Wherein, each of the elastic sections 50 has a guiding surface 51. The guiding surfaces 51 of the two elastic sections 50 are configured to respectively interact with the first structure 26 and the second structure 28. Preferably, the guiding surface 51 is an inclined surface or an arc surface.

Figure 5:
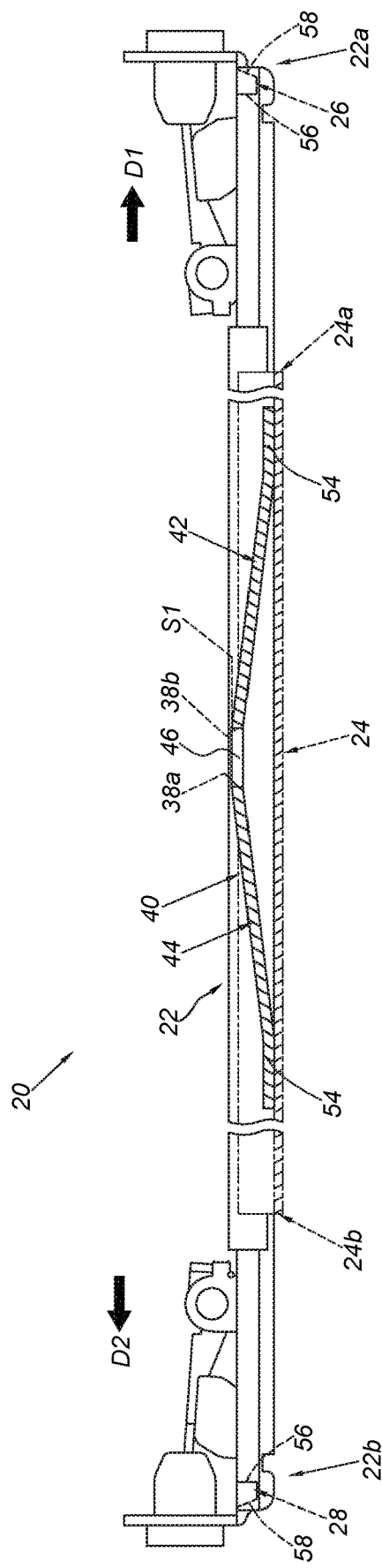
FIG. 5 is a diagram showing a slide rail of the slide rail assembly being located at a predetermined position relative to a supporting mechanism according to an embodiment of the present invention.

As shown in FIG. 5, the first structure 26 or the second structure 28 of the supporting mechanism 22 is a protrusion. In the present invention, both the first structure 26 and the second structure 28 are protrusions. Preferably, each of the first structure 26 and the second structure 28 has a blocking part 56 and a guiding part 58. The blocking part 56 and the guiding part 58 are located at opposite sides. Preferably, the guiding part 58 has an inclined surface or an arc surface.

Furthermore, the slide rail 24 is configured to be located at a predetermined position relative to the supporting mechanism 22, such as a retracted position. Wherein, when the slide rail 24 is located at the predetermined position, the slide rail 24 is located between the first structure 26 and the second structure 28. In addition, the slide rail 24 is movable relative to the supporting mechanism 22 from the predetermined position along a first direction D1 or a second direction D2. Wherein, the first direction D1 is opposite to the second direction D2. Wherein, the working member 40 is in a first state S1 (such as a state before being operated).

As shown in FIG. 6, when the slide rail 24 is moved from the predetermined position along the path 30 in the first direction D1, the guiding surface 51 of the first elastic part 42 of the working member 40 contacts the first structure 26 to generate an acting force applied to the working member 40, such that the working member 40 is no longer in the first state S1. In the meantime, the first elastic part 42 (and the second elastic part 44) is in a state of accumulating an elastic force.

As shown in FIG. 7, when the slide rail 24 is further moved along the first direction D1 to a first extension position E1, the first end 24a of the slide rail 24 exceeds beyond the first structure 26 (or the first end part 22a), and the first structure 26 is configured to block the first feature 38a in order to prevent the slide rail 24 from being moved from the first extension position E1 along the first direction D1. For example, when the slide rail 24 is located at the first extension position E1, the first structure 26 is located at a position corresponding to the space 46, such that the first elastic part 42 (and the second elastic part 44) releases the elastic force to allow the working member 40 to return to the first state S1. In the meantime, the first feature 38a and the second feature 38b are respectively located at two sides of the first structure 26. Wherein, the blocking part 56 of the first structure 26 is configured to block the first feature 38a, in order to prevent the slide rail 24 from being moved from the first extension position E1 along the first direction D1; or, the guiding part 58 of the first structure 26 is configured to block the second feature 38b, in order to prevent the slide rail 24 from being moved from the first extension position E1 along the second direction D2. Moreover, since the guiding part 58 of the first structure 26 has an inclined surface or an arc surface, a user can slightly apply a force to the slide rail 24 along the second direction D2 to allow the second feature 38b to cross the guiding part 58 of the first structure 26 along the second direction D2, such that the slide rail 24 can be retracted from the first extension position E1 along the second direction D2.

Figure 8:
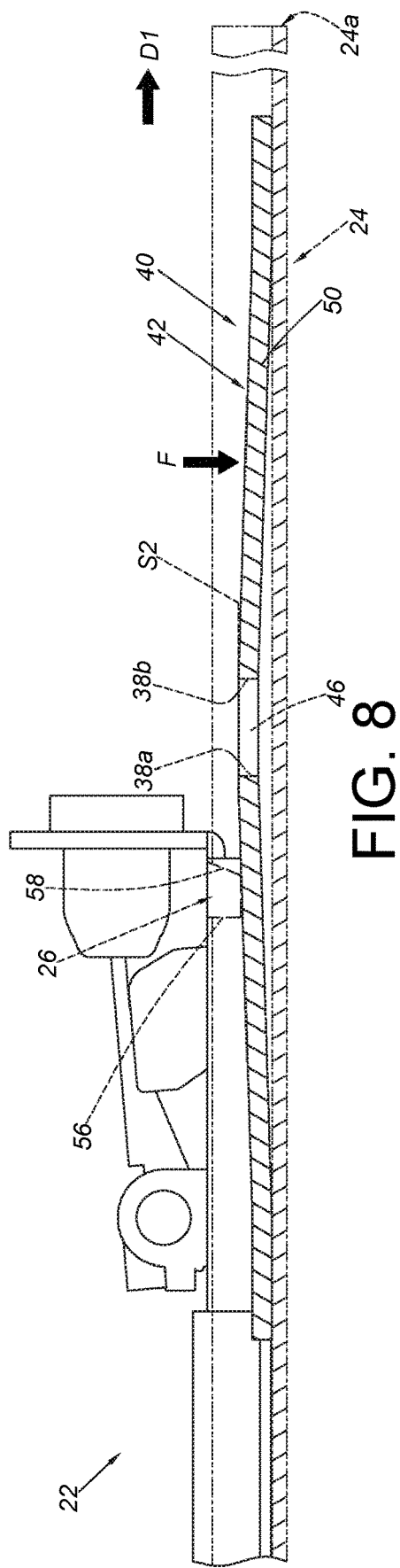
FIG. 8 is a diagram showing the slide rail of the slide rail assembly being further moved relative to the supporting mechanism along the first direction according to an embodiment of the present invention.
Figure 9:
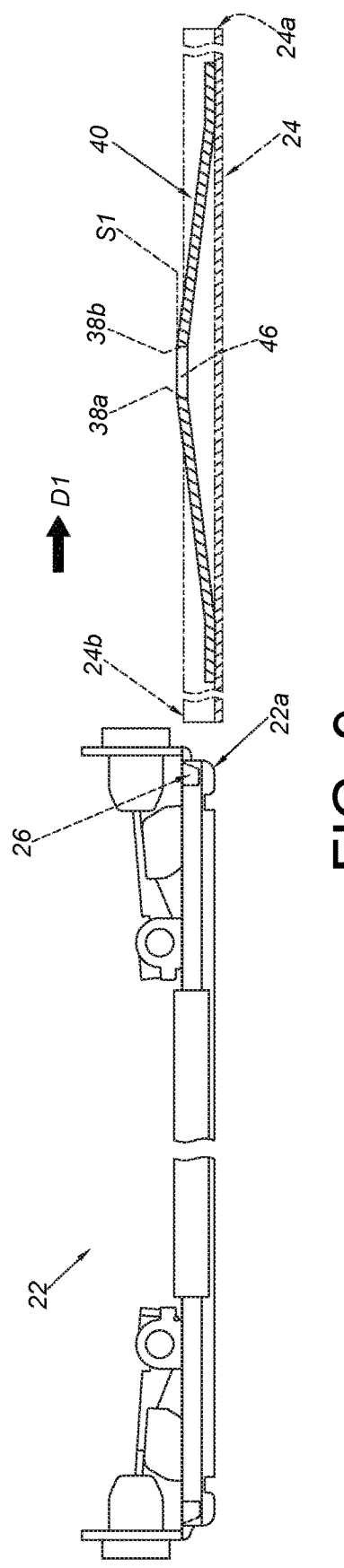
FIG. 9 is a diagram showing the slide rail of the slide rail assembly being further moved relative to the supporting mechanism along the first direction to be detached from the supporting mechanism according to an embodiment of the present invention.

Please refer to FIG. 7, FIG. 8 and FIG. 9. When the slide rail 24 is located at the first extension position E1 relative to the supporting mechanism 22 (as shown in FIG. 7), the user can operate the working member 40 to switch from the first state S1 to a second state S2 (such as a state after being operated shown in FIG. 8). When the working member 40 is in the second state S2, the blocking part 56 of the first structure 26 of the supporting mechanism 22 no longer blocks the first feature 38a of the working member 40, such that the slide rail 24 can be detached from the supporting mechanism 22 along the first direction D1 (as shown in FIG. 9). On the other hand, when the slide rail 24 is going to be mounted to the supporting mechanism 22 again, the user can insert the first end 24a of the slide rail 24 into the second end part 22b of the supporting mechanism 22, or insert the second end 24b of the slide rail 24 into the first end part 22a of the supporting mechanism 22.

Specifically, when the slide rail 24 is located at the first extension position E1 (as shown in FIG. 7) and when the elastic section (such as the elastic section 50 of the first elastic part 42) is pressed by a force F (as shown in FIG. 8), the first feature 38a and the second feature 38b are no longer located at the two sides of the first structure 26, such that the slide rail 24 at the first extension position E1 can be detached from the supporting mechanism 22 along the first direction D1 (as shown in FIG. 9), or the slide rail 24 at the first extension position E1 can be retracted relative to the supporting mechanism 22 along the second direction D2.

Figure 10:
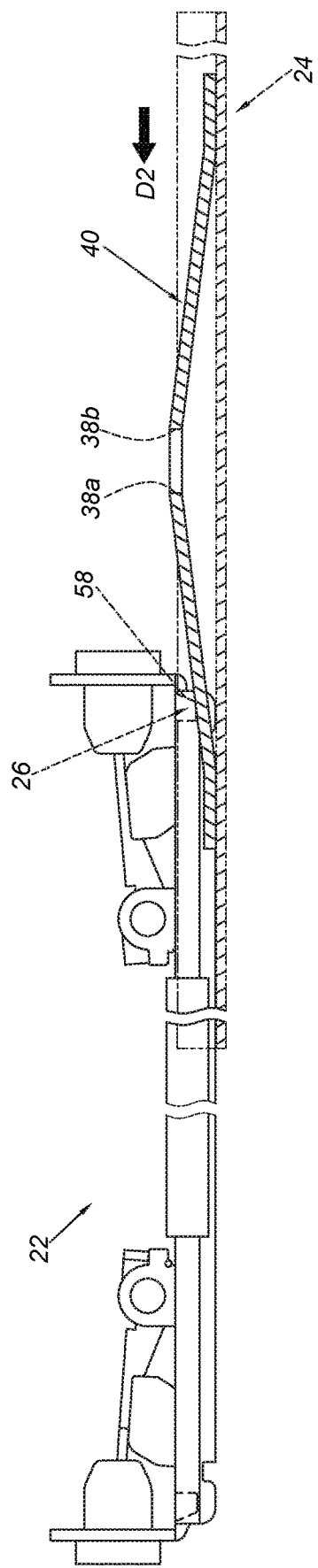
FIG. 10 is a diagram showing the detached slide rail of the slide rail assembly being mounted to the supporting mechanism along a second direction according to an embodiment of the present invention.

As shown in FIG. 10, when the detached slide rail 24 is going to be mounted to the supporting mechanism 22 again, the slide rail 24 can be mounted to the supporting mechanism 22 along the second direction D2 again. Since the guiding part 58 of the first structure 26 has an inclined surface or an arc surface, the user can slightly apply a force to the slide rail 24 along the second direction D2 to allow the second feature 38b to cross the guiding part 58 of the first structure 26 along the second direction D2, such that the slide rail 24 can be retracted from the first extension position E1 (please also refer to FIG. 7) along the second direction D2.

Figure 11:
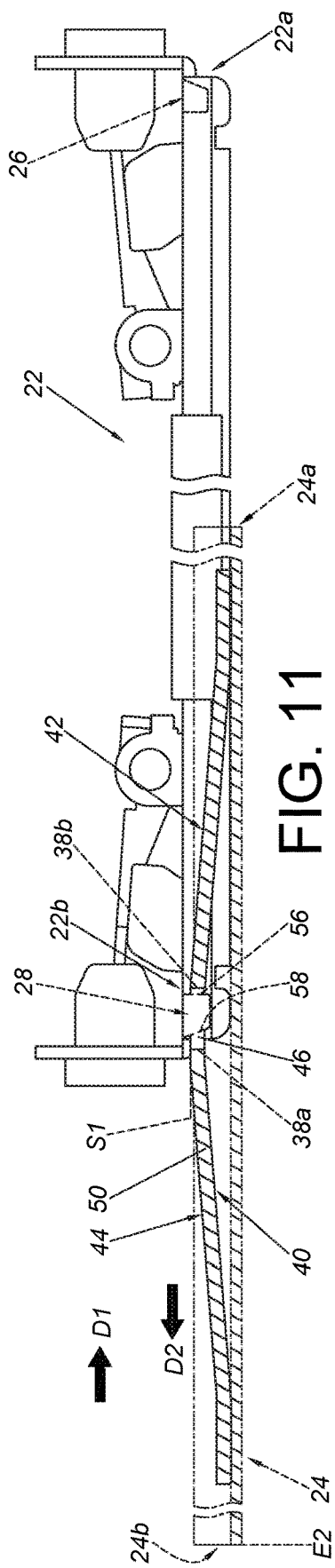
FIG. 11 is a diagram showing the slide rail of the slide rail assembly being moved relative to the supporting mechanism along the second direction to a second extension position according to an embodiment of the present invention.

As shown in FIG. 5 and FIG. 11, when the slide rail 24 is moved from the predetermined position (as shown in FIG. 5) to a second extension position E2 (as shown in FIG. 11) along the second direction D2, the second end 24b of the slide rail 24 exceeds beyond the second structure 28 (or the second end part 22b), and the second structure 28 is configured to block the second feature 38b in order to prevent the slide rail 24 from being moved from the second extension position E2 along the second direction D2.

For example, when the slide rail 24 is located at the second extension position E2, the second structure 28 is located at a position corresponding to the space 46, and the working member 40 is in the first state S1 due to the elastic force of the first elastic part 42 (and the second elastic part 44). In the meantime, the first feature 38a and the second feature 38b are respectively located at two sides of the second structure 28. Wherein, the blocking part 56 of the second structure 28 is configured to block the second feature 38b of the working member 40, in order to prevent the slide rail 24 from being moved from the second extension position E2 along the second direction D2; or, the guiding part 58 of the second structure 28 is configured to block the first feature 38a, in order to prevent the slide rail 24 from being moved from the second extension position E2 along the first direction D1. Moreover, since the guiding part 58 of the second structure 28 has an inclined surface or an arc surface, the user can slightly apply a force to the slide rail 24 along the first direction D1 to allow the first feature 38a to cross the guiding part 58 of the second structure 28 along the first direction D1, such that the slide rail 24 can be retracted from the second extension position E2 along the first direction D1.

Figure 12:
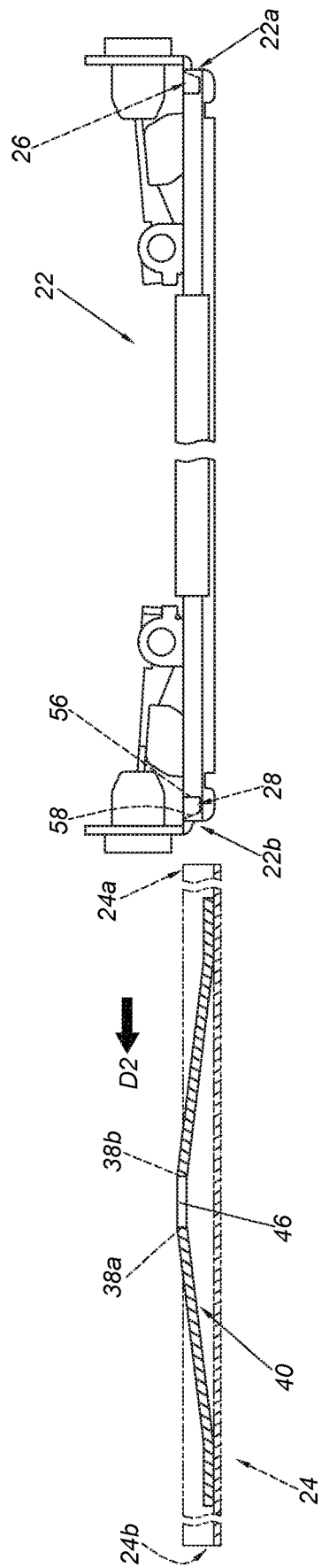
FIG. 12 is a diagram showing the slide rail of the slide rail assembly being moved relative to the supporting mechanism along the second direction to be detached from the supporting mechanism according to an embodiment of the present invention.

As shown in FIG. 11 and FIG. 12, when the slide rail 24 is located at the second extension position E2 and when the elastic section (such as the elastic section 50 of the second elastic part 44) is pressed to switch the working member 40 from the first state S1 to the second state S2, the first feature 38a and the second feature 38b are no longer located at the two sides of the second structure 28 (in other words, the second structure 28 no longer blocks the second feature 38b and the first feature 38a), such that the slide rail 24 at the second extension position E2 can be detached from the supporting mechanism 22 along the second direction D2 (as shown in FIG. 12); or the slide rail 24 at the second extension position E2 can be retracted relative to the supporting mechanism 22 along the first direction D1. Similarly, when the slide rail 24 is going to be mounted to the supporting mechanism 22 again, the user can insert the first end 24a of the slide rail 24 into the second end part 22b of the supporting mechanism 22, or insert the second end 24b of the slide rail 24 into the first end part 22a of the supporting mechanism 22.

Figure 13:
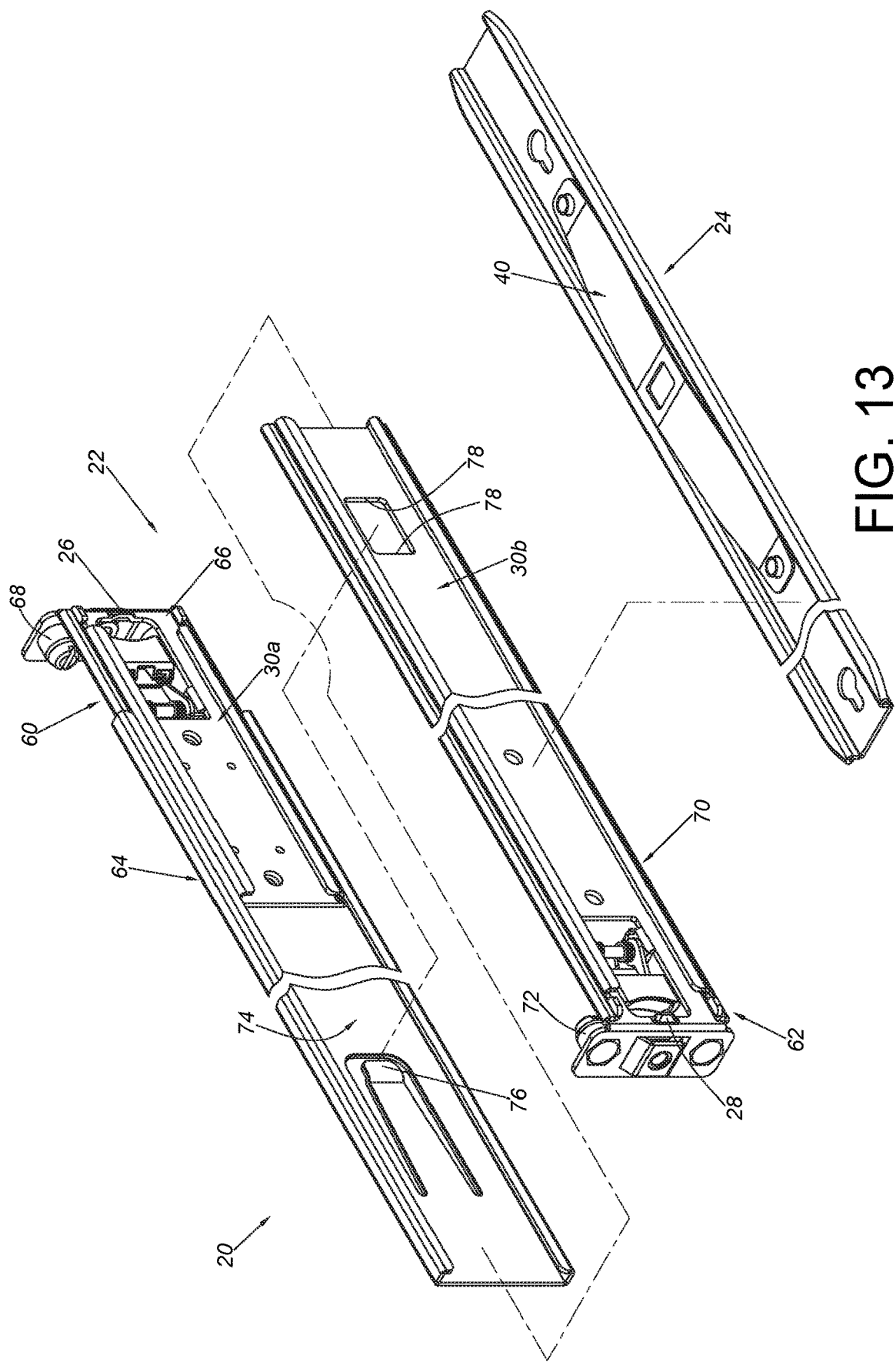
FIG. 13 is an exploded view of the slide rail assembly in a second implementation type according to an embodiment of the present invention.

As shown in FIG. 13 and FIG. 14, the supporting mechanism 22 comprises a first bracket 60 and a second bracket 62 according to an embodiment of the present invention. The first bracket 60 is arranged at one end of a supporting rail 64. Wherein, the first bracket 60 comprises a longitudinal supporting wall 66 and at least one first mounting member 68 adjacent to the longitudinal supporting wall 66. On the other hand, the second bracket 62 comprises an extension rail 70 and at least one second mounting member 72 adjacent to the extension rail 70. Wherein, the extension rail 70 is movably mounted in a supporting passage 74 of the supporting rail 64, such that the first bracket 60 and the second bracket 62 are retractable and movable relative to each other. The at least one second mounting member 72 can be moved closer to the other end of the supporting rail 64 by adjusting the extension rail 70 relative to the supporting rail 64. Wherein, one of the first bracket 60 and the second bracket 62 has the path 30. In the present embodiment, the longitudinal supporting wall 66 of the first bracket 60 and the extension rail 70 of the second bracket 62 are configured to respectively provide a first path 30a and a second path 30b communicating with each other. Moreover, the slide rail 24 is movable relative to the supporting mechanism 22 through the first path 30a and the second path 30b. Wherein, the first structure 26 is arranged on the longitudinal supporting wall 66 of the first bracket 60, and the second structure 28 is arranged on the extension rail 70 of the second bracket 62. When the slide rail 24 is located at the predetermined position (such as the retracted position), the slide rail 24 is located between the first structure 26 and the second structure 28. Wherein, the working member 40 is mounted to the slide rail 24. For simplification, no further illustration of the interaction between the working member 40, the first structure 26 and the second structure 28 is provided.

Preferably, the supporting rail 64 and the extension rail 70 have a first limiting feature 76 and a second limiting feature 78 respectively. For example, one of the first limiting feature 76 and the second limiting feature 78 is an elastic arm, and the other one of the first limiting feature 76 and the second limiting feature 78 is a boundary wall of a hole. The first limiting feature 76 and the second limiting feature 78 are configured to abut against each other. In the present embodiment, the first limiting feature 76 is an elastic arm, and the second limiting feature 78 is a boundary wall of a hole.

As shown in FIG. 14, the first bracket 60 and the second bracket 62 are respectively mounted to a first post 80 and a second post 82 of a rack through the at least one first mounting member 68 and the at least one second mounting member 72. Wherein, the first bracket 60 and the second bracket 62 can be adjusted to allow the supporting mechanism 22 to have a first length L1 corresponding to a first depth of the rack. Wherein, the first limiting feature 76 (as shown in FIG. 16) is a predetermined distance away from the second limiting feature 78 (as shown in FIG. 15). On the other hand, the slide rail 24 is configured to carry a carried object 84, such as an electronic apparatus or a drawer. Wherein, the slide rail 24 can be moved relative to the supporting mechanism 22 along the first direction D1 to be detached from the supporting mechanism 22; or the slide rail 24 can be moved relative to the supporting mechanism 22 along the second direction D2 to be detached from the supporting mechanism 22. For the operation of detaching the slide rail 24 from the supporting mechanism 22, please refer to FIG. 9, FIG. 12 and the aforementioned illustration, no further illustration is provided for simplification.

Figure 17:
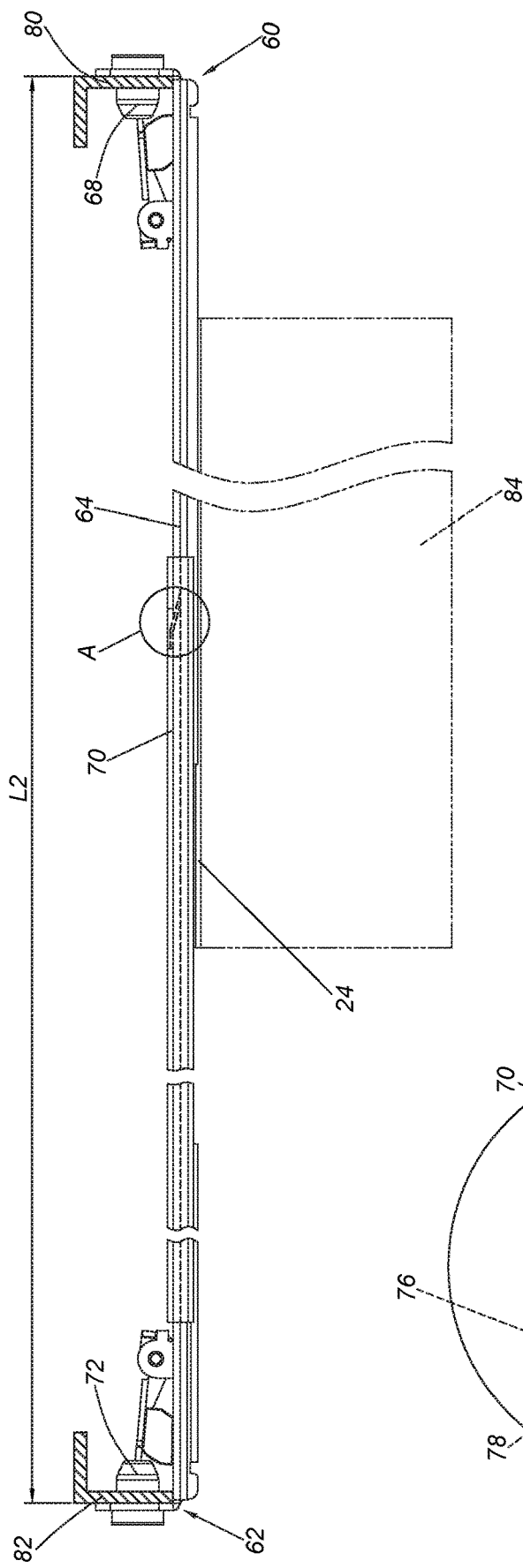
FIG. 17 is a diagram showing the slide rail assembly being mounted to a rack with a second depth, and the slide rail configured to carry the carried object according to an embodiment of the present invention.
Figure 18:
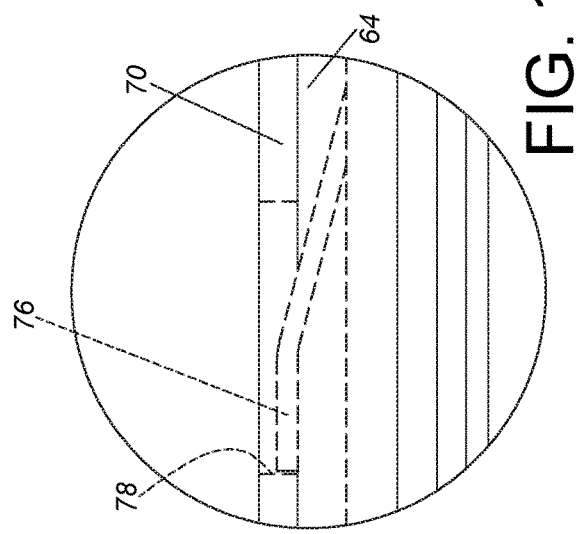
FIG. 18 is an enlarged view of an area A of FIG. 17.

As shown in FIG. 17, the first bracket 60 and the second bracket 62 can be adjusted to allow the supporting mechanism 22 to have a second length L2, which is greater than the first length L1, corresponding to a second depth of the rack. Moreover, the first limiting feature 76 and the second limiting feature 78 abut against each other (as shown in FIG. 18) to provide limiting effect.

Therefore, the slide rail assembly 20 of the embodiment of the present invention is characterized in that:

1. The slide rail 24 can be moved relative to the supporting mechanism 22 along the first direction D1 to be detached from the supporting mechanism 22, and the slide rail 24 can also be moved relative to the supporting mechanism 22 along the second direction D2 to be detached from the supporting mechanism 22, so as to facilitate maintenance of the slide rail assembly 20. In other words, when the slide rail 24 carries the carried object 84, the carried object 84 can be detached from the supporting mechanism 22 along the two directions through the slide rail 24, so as to facilitate maintenance.

2. The supporting mechanism 22 can be a slide rail, a bracket or a combination of a slide rail and a bracket configured to support the slide rail 24, and the slide rail 24 can be opened relative to the supporting mechanism 22 through the path 30 from a predetermined position (such as a retracted position) along the two directions.

3. Any one of the two ends of the slide rail 24 can be inserted and mounted into the supporting mechanism 22, in order to meet various installation requirements of the user.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
   a supporting mechanism comprising a first structure, a second structure and a path arranged between the first structure and the second structure; and
   a slide rail movable through the path, the slide rail having a first end and a second end, a first feature and a second feature being arranged between the first end and the second end;
   wherein when the slide rail is moved along the path in a first direction to a first extension position, the first end of the slide rail exceeds beyond the first structure, and the first structure is configured to block the first feature, in order to prevent the slide rail from being moved from the first extension position along the first direction;
   wherein when the slide rail is moved along the path in a second direction to a second extension position, the second end of the slide rail exceeds beyond the second structure, and the second structure is configured to block the second feature, in order to prevent the slide rail from being moved from the second extension position along the second direction;
   wherein the first direction is opposite to the second direction;
   wherein the slide rail assembly further comprises a working member having at least one end abutting against and mounted to a side wall of the slide rail through matching a connecting object and a longitudinal hole with a diameter greater than a diameter of the connecting object; wherein the working member is arranged with the first feature and the second feature; wherein the at least one end of the working member is longitudinally movable on the side wall relative to the slide rail within a limited range defined by the connecting object and the longitudinal hole when the working member is pressed.

2. The slide rail assembly of claim 1, wherein the first structure is arranged adjacent to a first end part of the supporting mechanism, and the second structure is arranged adjacent to a second end part of the supporting mechanism.

3. The slide rail assembly of claim 1, wherein when the slide rail is located at the first extension position, the first structure is configured to block the second feature, in order to prevent the slide rail from being moved from the first extension position along the second direction.

4. The slide rail assembly of claim 3, wherein when the slide rail is located at the second extension position, the second structure is configured to block the first feature, in order to prevent the slide rail from being moved from the second extension position along the first direction.

5. The slide rail assembly of claim 4, wherein a space is formed between the first feature and the second feature; when the slide rail is located at the first extension position, the first structure is located at a position corresponding to the space, and the first feature and the second feature are respectively located at two sides of the first structure; when the slide rail is located at the second extension position, the second structure is located at a position corresponding to the space, and the first feature and the second feature are respectively located at two sides of the second structure.

6. The slide rail assembly of claim 5, wherein the working member comprises two elastic parts, and the first feature and the second feature are arranged between the two elastic parts.

7. The slide rail assembly of claim 6, wherein each of the two elastic parts has a connecting section and an elastic section, the connecting section is mounted to the slide rail, the elastic section is extended from the connecting section and tilted relative to the connecting section, and the first feature and the second feature are respectively arranged on the two elastic sections.

8. The slide rail assembly of claim 7, wherein when the slide rail is located at the first extension position and when at least one of the elastic sections is pressed, the first feature and the second feature are no longer located at the two sides of the first structure, such that the slide rail at the first extension position is detachable from the supporting mechanism along the first direction, or the slide rail at the first extension position is retractable relative to the supporting mechanism along the second direction.

9. The slide rail assembly of claim 8, wherein when the slide rail is located at the second extension position and when at least one of the elastic sections is pressed, the first feature and the second feature are no longer located at the two sides of the second structure, such that the slide rail at the second extension position is detachable from the supporting mechanism along the second direction, or the slide rail at the second extension position is retractable relative to the supporting mechanism along the first direction.

10. The slide rail assembly of claim 7, wherein at least one of the elastic sections has a guiding surface configured to interact with the first structure or the second structure.

11. The slide rail assembly of claim 1, wherein the first structure and/or the second structure is a protrusion.

12. The slide rail assembly of claim 2, wherein the supporting mechanism comprises a first bracket and a second bracket retractably movable relative to each other, one of the first bracket and the second bracket has the path, and the first bracket and the second bracket respectively comprise at least one first mounting member and at least one second mounting member configured to be mounted to a rack.

13. A slide rail assembly, comprising:
   a supporting mechanism;
   a slide rail; and
   a working member operatively mounted to the slide rail, the working member being configured to be in one of a first state and a second state, the working member having at least one end abutting against and mounted to a side wall of the slide rail through matching a connecting object and a longitudinal hole with a diameter greater than a diameter of the connecting object;
   wherein the supporting mechanism and the slide rail are movably mounted relative to each other through a passage;
   wherein when the slide rail is moved from a predetermined position to a first extension position along a first direction and when the working member is in the first state, a first structure of the supporting mechanism is configured to block a first feature of the working member in order to prevent the slide rail from being moved along the first direction;
   wherein when the working member is operated to be switched from the first state to the second state, the first structure of the supporting mechanism no longer blocks the first feature of the working member, such that the slide rail is detachable from the supporting mechanism along the first direction;

wherein when the slide rail is moved from the predetermined position to a second extension position along a second direction and when the working member is in the first state, a second structure of the supporting mechanism is configured to block a second feature of the working member in order to prevent the slide rail from being moved along the second direction;

wherein when the working member is operated to be switched from the first state to the second state, the second structure of the supporting mechanism no longer blocks the second feature of the working member, such that the slide rail is detachable from the supporting mechanism along the second direction;

wherein the first direction is opposite to the second direction;

wherein the at least one end of the working member is longitudinally movable on the side wall relative to the slide rail within a limited range defined by the connecting object and the longitudinal hole when the working member is pressed.

14. The slide rail assembly of claim 13, wherein the first structure is arranged adjacent to a first end part of the supporting mechanism, and the second structure is arranged adjacent to a second end part of the supporting mechanism.

15. The slide rail assembly of claim 13, when the slide rail is located at the first extension position, the first structure is configured to block the second feature, in order to prevent the slide rail from being moved from the first extension position along the second direction.

16. The slide rail assembly of claim 15, wherein when the slide rail is located at the second extension position, the second structure is configured to block the first feature, in order to prevent the slide rail from being moved from the second extension position along the first direction.

17. The slide rail assembly of claim 16, wherein a space is formed between the first feature and the second feature; when the slide rail is located at the first extension position and when the working member is in the first state, the first structure is located at a position corresponding to the space, and the first feature and the second feature are respectively located at two sides of the first structure; when the slide rail is located at the second extension position and when the working member is in the first state, the second structure is located at a position corresponding to the space, and the first feature and the second feature are respectively located at two sides of the second structure.

18. The slide rail assembly of claim 17, wherein the working member comprises two elastic parts, and the first feature and the second feature are arranged between the two elastic parts.

19. The slide rail assembly of claim 18, wherein each of the two elastic parts has a connecting section and an elastic section, the connecting section is mounted to the slide rail, the elastic section is extended from the connecting section and tilted relative to the connecting section, and the first feature and the second feature are respectively arranged on the two elastic sections.

20. The slide rail assembly of claim 19, wherein when the slide rail is located at the first extension position and when at least one of the elastic sections is pressed to be switched from the first state to the second state, the first feature and the second feature are no longer located at the two sides of the first structure, such that the slide rail at the first extension position is detachable from the supporting mechanism along the first direction, or the slide rail at the first extension position is retractable relative to the supporting mechanism along the second direction; when the slide rail is located at the second extension position and when at least one of the elastic sections is pressed to be switched from the first state to the second state, the first feature and the second feature are no longer located at the two sides of the second structure, such that the slide rail at the second extension position is detachable from the supporting mechanism along the second direction, or the slide rail at the second extension position is retractable relative to the supporting mechanism along the first direction.

\* \* \* \* \*